US012772381B2

(12) United States Patent
Besseler et al.

(10) Patent No.: US 12,772,381 B2
(45) Date of Patent: Oct. 20, 2026

(54) CORNER SHIELD PROTECTION FOR SURFACE MOUNT DEVICES

(71) Applicant: Snap Inc., Santa Monica, CA (US)

(72) Inventors: Edmilson Besseler, San Jose, CA (US); Shu-Fong Tsau, Palatine, IL (US)

(73) Assignee: Snap Inc., Santa Monica, CA (US)

( * ) Notice: Subject to any disclaimer, the term of this patent is extended or adjusted under 35 U.S.C. 154(b) by 209 days.

(21) Appl. No.: 18/819,749

(22) Filed: Aug. 29, 2024

(65) Prior Publication Data

US 2025/0081351 A1 Mar. 6, 2025

Related U.S. Application Data

(60) Provisional application No. 63/535,675, filed on Aug. 31, 2023.

(51) Int. Cl.
*H05K 1/18* (2026.01)
*H05K 1/181* (2026.01)

(52) U.S. Cl.
CPC ... *H05K 1/181* (2013.01); *H05K 2201/10371* (2013.01)

(58) Field of Classification Search
CPC ......... H05K 1/181; H05K 2201/10371; H05K 2201/10969; H05K 3/303
See application file for complete search history.

(56) References Cited

U.S. PATENT DOCUMENTS

| | | | | |
|---|---|---|---|---|
| 2008/0112143 A1 | 5/2008 | Hanley | | |
| 2009/0084586 A1 * | 4/2009 | Nielsen | H05K 1/0218 29/829 | |
| 2021/0274692 A1 | 9/2021 | Chang et al. | | |

OTHER PUBLICATIONS

"International Application Serial No. PCT US2024 044500, International Search Report mailed Dec. 16, 2024", 4 pgs.
"International Application Serial No. PCT US2024 044500, Written Opinion mailed Dec. 16, 2024", 6 pgs.
"International Application Serial No. PCT/US2024/044500, International Preliminary Report on Patentability mailed Mar. 12, 2026", 8 pgs.

* cited by examiner

*Primary Examiner* — Sherman Ng
(74) *Attorney, Agent, or Firm* — Schwegman Lundberg & Woessner, P.A.

(57) ABSTRACT

In some examples, a corner shield is provided for protecting a surface-mount device (SMD) on a printed circuit board (PCB). An example corner shield comprises a rigid structure configured to conform to a corner area of the SMD, and one or more mounting surfaces configured to mount the rigid structure to one or more soldering pads on the PCB adjacent to the SMD.

17 Claims, 6 Drawing Sheets

CORNER SHIELD PROTECTION FOR SURFACE MOUNT DEVICES

CLAIM OF PRIORITY

This patent application claims the benefit of priority, under 35 U.S.C. Section 119 (e), to Besseler et al, U.S. Provisional Patent Application Ser. No. 63/535,675, entitled "CORNER SHIELD PROTECTION FOR SURFACE MOUNT DEVICES," filed on Aug. 31, 2023, which is hereby incorporated by reference herein in its entirety.

BACKGROUND

Surface-mount technology (SMT) is a method in which electrical components are mounted directly onto the surface of a printed circuit board (PCB). An electrical component mounted in this manner can be referred to as a surface-mount device (SMD). In general, SMDs are fragile parts and often require careful handling. However, in a few cases, due to design limitations they become placed in locations that are more susceptible to mechanical stresses, despite their fragility. For example, an SMD might be placed at an edge of the PCB which is also used for handling during an assembly process or placed near a mounting hole where a screwdriver could accidentally hit the SMD. Some SMDs may be located in areas where a tight fit assembly is required.

In such cases, mechanical shock and stresses can cause permanent or latent damage to an SMD part. Among SMD parts, ceramic capacitors, and silicon body parts, such as diodes and wafer-level chip scale packaging (WCSP) integrated circuits (IC), are often the most susceptible parts to suffer damage from mechanical shock due to the inherently brittle and fragile nature of the materials from which they are made.

Traditional efforts to address this issue in the electronic industry have included encapsulation methods. Encapsulating SMDs with epoxies or acrylates materials are common practices to provide extra mechanical protection to the parts, but this comes at the cost of taking additional volume on the final product assembly. As user devices become smaller and smaller, the need to take additional volume can be undesirable. Current technology increasingly moves towards miniaturization.

Other drawbacks of conventional encapsulation can include undesirable impacts on heat mitigation, transfer, and management. The functionality of a component can also be affected, for example in the case of targeting radio frequency (RF) parts or sensors. Component reliability can also be affected, for example, where mismatches of coefficients of thermal expansion (CTE) between the parts and the encapsulant material induces stress to the devices when exposed to thermal cycles. Cyclical stresses lead to cracking, causing an SMD to malfunction or totally lose its functionality. The encapsulation process can also be costly as it involves an additional process in assembly and requires expensive equipment to dispense and cure the encapsulant material, taking up significant floor space.

BRIEF DESCRIPTION OF THE DRAWINGS

In the drawings, which are not necessarily drawn to scale, like numerals may describe similar components in different views. Some nonlimiting examples are illustrated in the figures of the accompanying drawings in which.

DETAILED DESCRIPTION

In some examples, a corner shield is provided that can be selectively placed at or adjacent a corner of a device during an SMT process. The device may be an SMD device identified as being vulnerable to extra mechanical or thermal stress during fabrication of a PCB, or in use thereafter. The corner shield can be constructed from typical electromagnetic interference (EMI) shield materials (for example copper or aluminum alloys sheets, plated with nickel) and/or include stainless steel if fabrication or working conditions require extra protection of the SMD protected by the corner shield.

An example corner shield embodies a compact, rigid shape such that the corner shield can be made, placed, and/or soldered onto soldering pads located adjacent to one or more corners of a component (e.g., an SMD) for which extra protection is desired. In some examples, the corner shield can be picked and placed by existing SMT equipment already used to assemble PCBs. This convenience may avoid additional investment in equipment.

Application of a protective corner shield to a given SMD, for example, can mitigate, if not avoid, increases in reliability risk because, unlike an encapsulant, the protected SMD part and the walls of the protective corner shield do not touch each other. Undesirable or unexpected interactions arising through contact between the SMD and the corner shield can be reduced or avoided.

In some examples, even though a corner shield may occupy some "space", significant comparative space savings overall can be achieved while still providing device protection. In some examples, the volume taken by a corner shield is only about 25% of the volume taken by an encapsulation.

To save costs, some examples enable judicious selection of one or more corners for protection, while leaving other corners at an original (or unprotected) size. A conventional encapsulation process does not necessarily allow this selective placement since thermal cycle risks imposed by the cladding encapsulant material can exacerbate exponentially.

These and other aspects and potential benefits are described more fully below.

As mentioned above, some examples of the present corner shield can be used to protect SMDs on PCBs installed in user devices in which available space is very limited. One such device may be a head-wearable apparatus for viewing augmented reality, for example. Applications of the present examples in other space-constrained devices are possible. Although an illustrative example is described below in the context of a head-wearable apparatus such as glasses, this should not be regarded as a limiting application. In other examples and applications, the corner shield may be used in any electronic device that has a PCB assembly in it.

Figure 1:
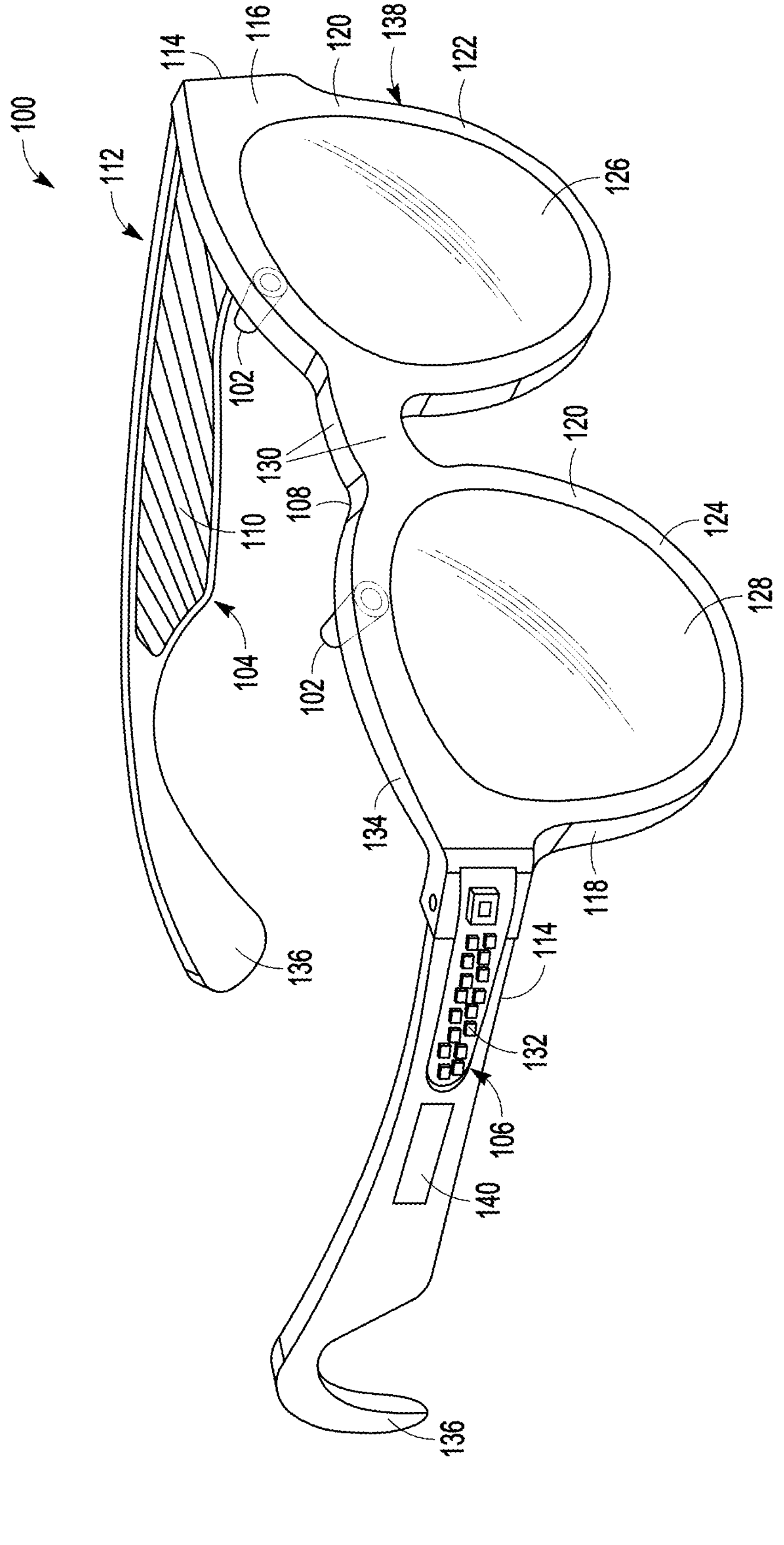
FIG. 1 is a perspective view of a wearable device, in accordance with some example embodiments.

For example, FIG. 1 shows a perspective view of a head-wearable device (e.g., glasses 100), in accordance with some example embodiments. The form factor of the glasses 100 is very compact and space available for internal componentry is very tight. The glasses 100, in this instance, can be worn to view augmented content displayed in a content interaction system. By way of brief background, augmented reality technology aims to bridge a gap between virtual environments and a real-world environment by providing an enhanced real-world environment that is augmented with electronic information. As a result, the electronic information appears to be part of the real-world environment as perceived by a user. In an example, augmented reality technology further provides a user interface to interact with the electronic information that is overlaid in the enhanced real-world environment. It can be important to boost user experience in an augmented environment that the augmented viewing device, such as the glasses 100, are unobtrusive, compact, and light.

The example glasses 100 of FIG. 1 can include a small frame 112 made from any suitable material such as plastic or metal, including any suitable shape memory alloy. In one or more embodiments, the frame 112 includes a front piece 138 including a first, or left, optical element holder 122 (e.g., a display or lens holder) and a second, or right, optical element holder 124 connected by a nose piece or bridge 130. The front piece 138 additionally includes a left end portion 116 and a right end portion 118. A first, or left, optical element 126 and a second, or right, optical element 128 can be provided within respective left optical element holder 122 and right optical element holder 124. Each of the right optical elements 128 and the left optical elements 126 can be a lens, a display, a display assembly, or a combination of the foregoing. Any of the display assemblies disclosed herein can be provided in the glasses 100.

The frame 112 additionally includes a left arm or temple piece 104 and a right arm or temple piece 106 coupled to the respective left end portion 116 and the right end portion 118 of the front piece 138 by any suitable means such as a hinge (not shown), so as to be coupled to the front piece 138, or rigidly or otherwise secured to the front piece 138, so as to be integral with or secured to the front piece 138. In one or more implementations, each of the temple piece 104 and the temple piece 106 includes a first portion 114 that is coupled to the respective left end portion 116 or right end portion 118 of the front piece 138, and any suitable second portion 136 for coupling to the ear of the user. In one embodiment, the front piece 138 can be formed from a single piece of material, so as to have a unitary or integral construction. In one embodiment, such as illustrated in FIG. 1, the entire frame 112 can be formed from a single piece of material so as to have a unitary or integral construction.

The glasses 100 can include a computing device, such as a computer 132, which can be of any suitable type so as to be carried by the frame 112 and, in one or more embodiments of a suitable size and shape, so as to be at least partially disposed in one of the temple piece 104 and the temple piece 106. In one or more embodiments, as illustrated in FIG. 1, the computer 132 is sized and shaped similar to the size and shape of one of the temple piece 106 (e.g., or the temple piece 104), and is thus disposed almost entirely if not entirely within the structure and confines of such temple piece 106. In one or more embodiments, the computer 132 is disposed in both of the temple piece 104 and the temple piece 106. The computer 132 can include one or more printed circuit boards (PCBs) and one or more hardware processors with memory, wireless communication circuitry, and a power source. In some examples, the computer 132 comprises low-power circuitry, high-speed circuitry, and a display processor. Various other embodiments may include these elements in different configurations or integrated together in different ways.

The computer 132 additionally includes a battery 110 or another suitable portable power supply. In one embodiment, the battery 110 is disposed in one of the temple pieces 104 or the temple piece 106. In the glasses 100 shown in FIG. 1, the battery 110 is shown as being disposed in left temple piece 104 and electrically coupled using the connection 134 to the remainder of the computer 132 disposed in the right temple piece 106. The glasses 100 can include a connector or port (not shown) suitable for charging the battery 110 accessible from the outside of frame 112, a wireless receiver, transmitter, or transceiver (not shown) or a combination of such devices.

In one or more implementations, the glasses 100 include cameras 102. Although two cameras are depicted, other embodiments contemplate the use of a single or additional (i.e., more than two) cameras. In one or more embodiments, the glasses 100 include any number of input sensors or peripheral devices in addition to the cameras 102. The front piece 138 is provided with an outward facing, forward-facing or front or outer surface 120 that faces forward or away from the user when the glasses 100 are mounted on the face of the user, and an opposite inward-facing, rearward-facing or rear or inner surface 108 that faces the face of the user when the glasses 100 are mounted on the face of the user. Such sensors can include inwardly-facing video sensors or digital imaging modules such as cameras that can be mounted on or provided within the inner surface 108 of the front piece 138 or elsewhere on the frame 112 so as to be facing the user, and outwardly-facing video sensors or digital imaging modules such as the cameras 102 that can be mounted on or provided with the outer surface 120 of the front piece 138 or elsewhere on the frame 112 so as to be facing away from the user. Such sensors, peripheral devices or peripherals can additionally include biometric sensors, location sensors, or any other such sensors. In one or more implementations, the glasses 100 include a track pad 140 or other touch or sensory input device to receive navigational commands from the user. One or more track pads 140 may be provided at convenient locations for user interaction on one or both of the temple piece 104 and the temple piece 106.

Figure 2A:
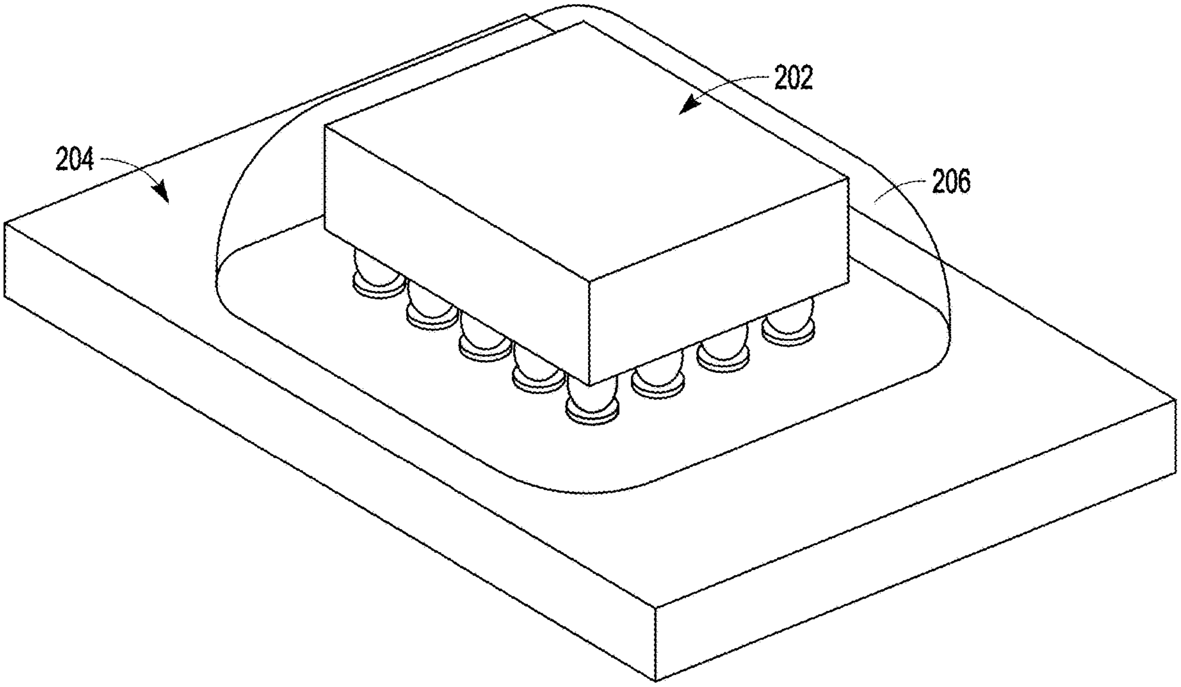
FIG. 2A (PRIOR ART)
FIG. 2A is prior art and includes a pictorial view of an example SMD encapsulation.
Figure 2B:
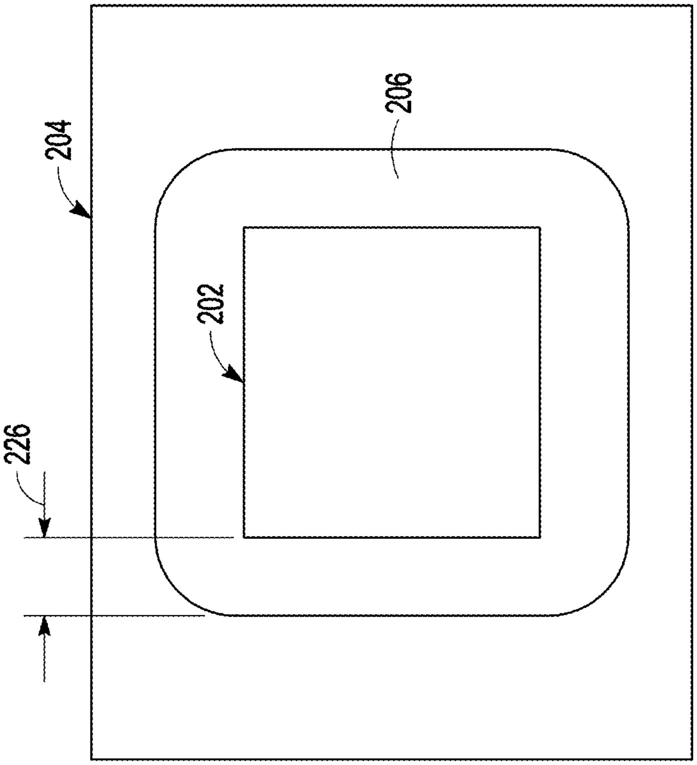
FIG. 2B (PRIOR ART)
FIG. 2B is prior art and includes a top view of an example SMD encapsulation.
Figure 2C:
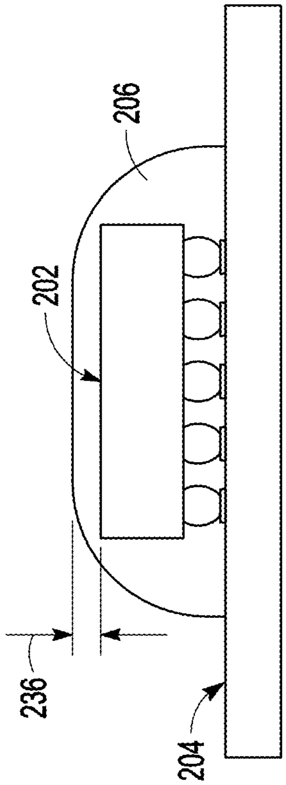
FIG. 2C (PRIOR ART)
FIG. 2C is prior art and includes a side view of an example SMD encapsulation.

As mentioned above, the computer 132 of the glasses 100 can include one or more printed circuit boards (PCBs) and one or more hardware processors with memory, wireless communication circuitry, and a power source. The PCBs and componentry may include one or more SMDs. In some instances, due to design limitations, these SMDs are placed in locations that are more susceptible to mechanical stresses and require increased protection. To this end, and with reference to FIG. 2A, FIG. 2B and FIG. 2C, traditional attempts in the electronic industry have included encapsulating the parts with epoxies or acrylates materials to provide extra mechanical protection to the parts. Protection via encapsulation comes at the cost of taking significant additional volume on the final product assembly. In these views, an SMD 202 is surface-mounted on a PCB 204 and is enclosed in a conventional encapsulation 206. Of note in FIG. 2B is that a side thickness 226 or width of the encapsulation 206 can be as much as approximately 1 millimeter (mm) in some conventional examples. In FIG. 2C, a top thickness 236 of the encapsulation 206 can be as much as 0.3 mm.

Figure 3:
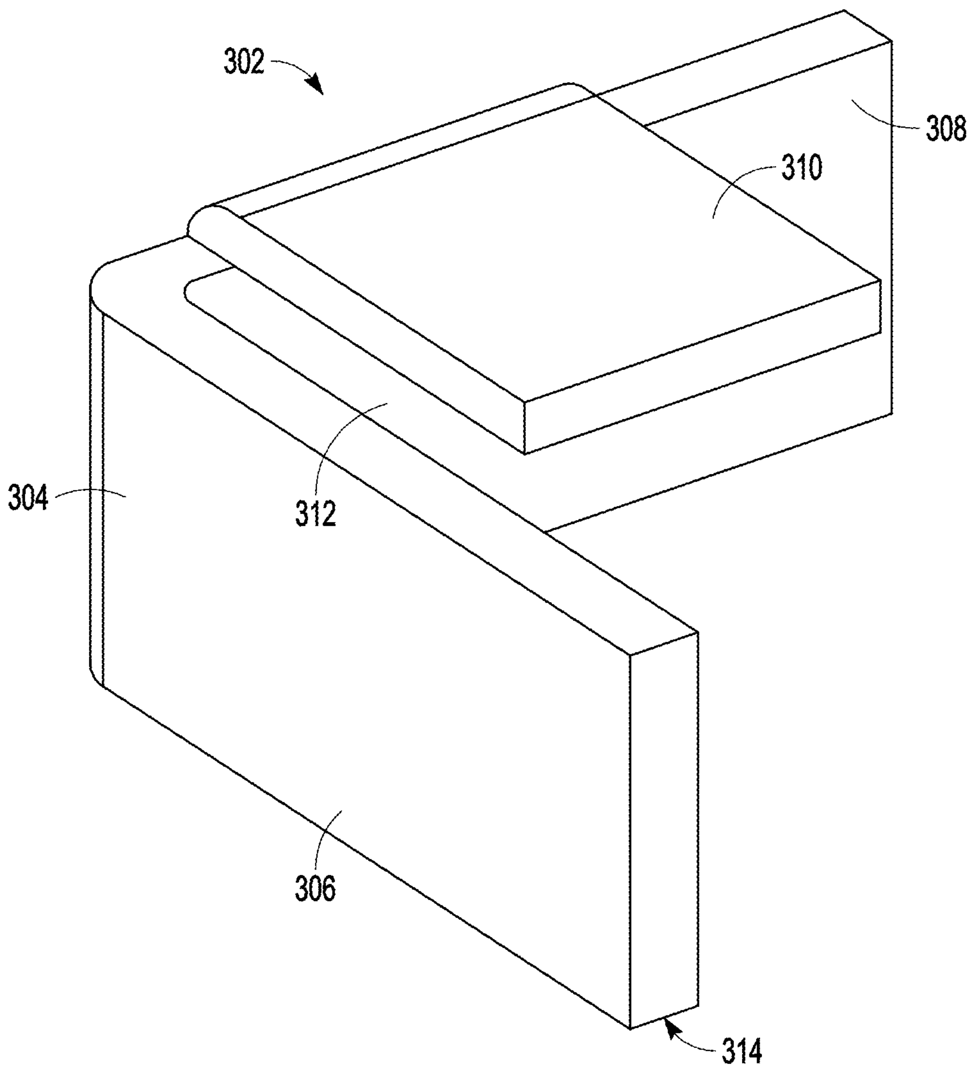
FIG. 3 illustrates an example corner shield.

On the other hand, with reference to FIG. 3, an example corner shield 302 of the present disclosure is provided for protecting an SMD 202 on a PCB 204. Example deployments of the corner shield 302 to protect an SMD 202 can be seen in FIG. 4 and FIG. 5, for example. Other deployments and/or configurations of the corner shield 302 are possible.

Figure 4:
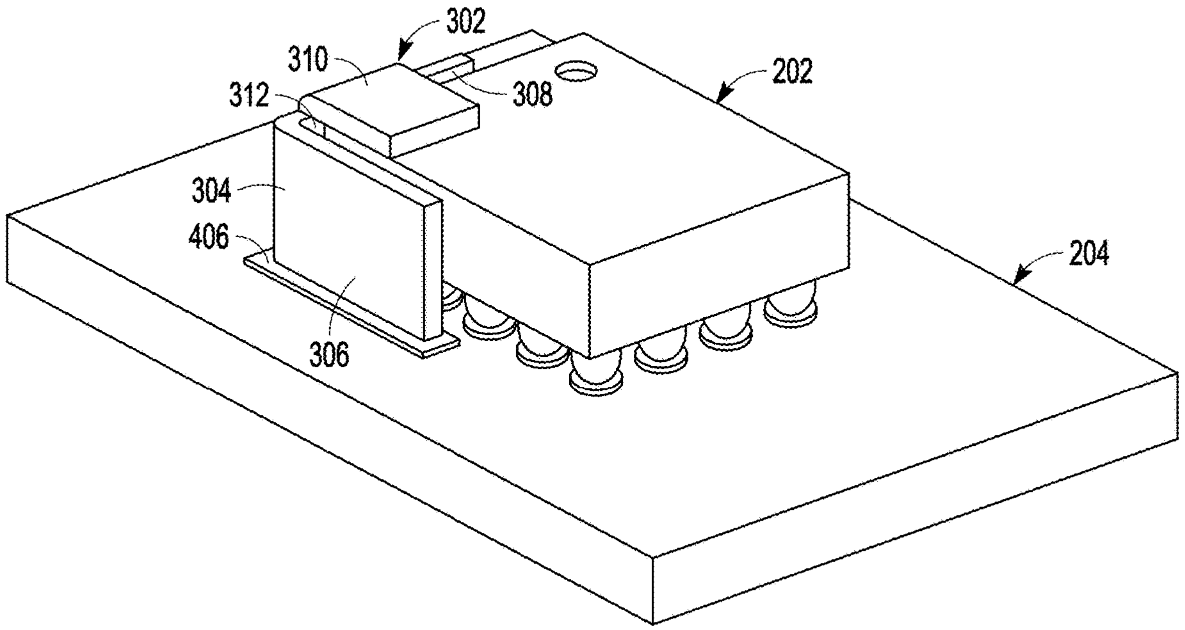
FIG. 4 and FIG. 5 illustrate example deployments of a corner shield.
Figure 5:
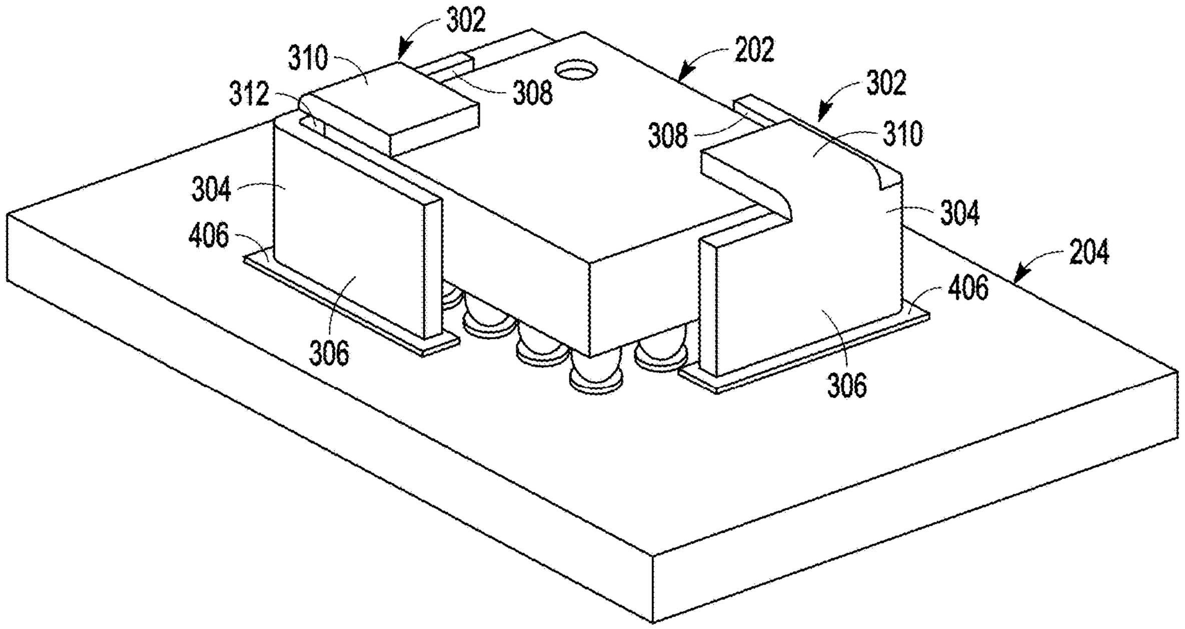

In the illustrated examples, the corner shield 302 comprises a rigid structure 304 configured to conform to a corner area of an SMD 202. In FIG. 4, a single corner shield 302 is deployed to protect a selected single corner of an SMD 202. This single corner of the SMD 202 may have been selected on the basis of its increased exposure, or risk of increased exposure, to high mechanical stress for example. Other corner selection factors are possible. In FIG. 5, two diametrically opposite corners are selected for protection, for example on a basis similar to the selection of the single corner of FIG. 4. It will be appreciated that the deployment of the corner shield 302 is highly configurable. Many other corner protection deployment configurations and/or corner selections for a given SMD 202 location are possible.

As shown, the rigid structure 304 of the corner shield 302 includes a first protective wall 306, a second protective wall 308 disposed or extending substantially orthogonally thereto, and a protective overhang structure 310. The orthogonal or sideways-extending arrangement of the second protective wall 308 with respect to the first protective wall 306 provides the rigid structure 304 with a degree of lateral or areal support and enables a strong, stable, and secure footing on the PCB 204. The rigid structure 304 of the corner shield 302 is configured to absorb mechanical shocks and impacts to protect the SMD 202 from damage.

In some examples, the protective overhang structure 310 is shaped and arranged to define a vent 312 or other passage or structure to assist in dissipation of heat generated by the SMD 202. The vent 312, or passage, may be defined or provided between an edge of the protective overhang structure 310 and an edge of the first protective wall 306 and/or an edge of the second protective wall 308. Other heat-dissipating arrangements and/or vents are possible. In some examples, the open-sided configuration of the corner shield 302 can assist to release heat generated by the SMD 202. The diverging first protective wall 306 and laterally aligned second protective wall 308 do not define a fully enclosed structure that might otherwise trap heat, like a conventional encapsulation for example. The open configuration of the corner shield 302 also allows access for the selective application of a heat-transferring thermal gel in open spaces, for example underneath the protective overhang structure 310 or alongside either of the first protective wall 306 and/or the second protective wall 308. The thermal gel may be applied to extend along the full length or a portion of the first protective wall 306 and/or the second protective wall 308.

The flat upper surface of the protective overhang structure 310 can also serve as a vacuum pick up area or zone. For example, a vacuum nozzle in a pick and place SMT process can be brought against the protective overhang structure 310 to apply vacuum pressure, lift and hold the corner shield 302 to move it (or relocate it) to a desired location on the PCB for soldering. To this end, a pickup area of a protective overhang structure 310 can be determined using the formula:

$P=F/A$ where P=Pressure, F=Force, and A=Area.

In an example, a typical SMT pick and place machine vacuum exerts a negative or vacuum pressure of 53.33 kPa or 53.33 $N^*m^{-2}$. Here, F=mass of the corner shield 302 (m)*gravity acceleration (a). For this example, assume a brass corner shield 302 is selected (neglecting an Ni finish), and assume the density of brass is approximately 8.5 g/$cm^3$. For an example corner shield 302 made of sheet metal 2.5 mm×2.5 mm×0.2 mm, then V (volume) of corner shield 302=1.25 $mm^3$ or V=0.00125 $cm^3$. Using the formula m (mass)=d. V, then m=0.01 g, or m=0.00001 kg.

In considering the interaction between the above example corner shield 302 and an appropriate vacuum pickup nozzle to pick up and place the corner shield 302, assume A=Area of the pickup nozzle corresponding to the pickup area of the protective overhang structure 310 available for pickup. From the formula further above, A=F/P, and by applying this formula we derive A=1.88e-6 $m^2$ or A=1.88 $mm^2$. Based on these calculations, it can be determined that the protective overhang structure 310 should be sized to present a flat surface to present a pickup area ≥1.88 $mm^2$. To select an appropriately sized pickup nozzle for this pickup area, assume for a circular pickup nozzle A=π·r^2, here r≥0.77 mm. A protective overhang structure 310 and vacuum pickup nozzle may be configured and selected to work together, accordingly.

Figure 6A:
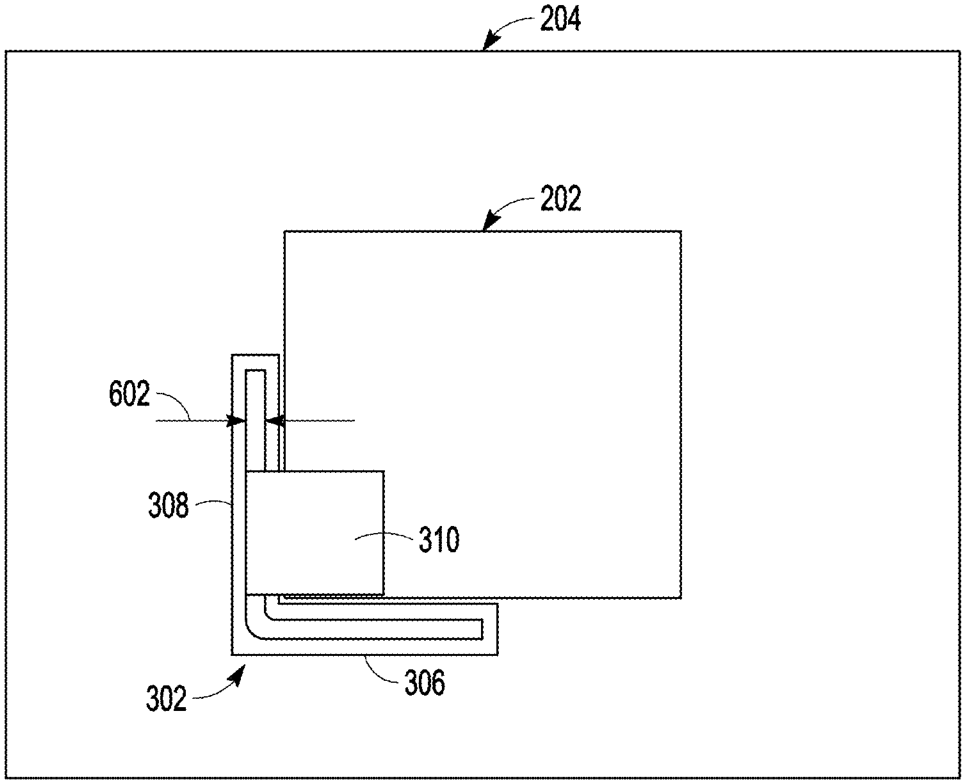
FIG. 6A is a top view of an example corner shield adjacent a protected SMD.

In some examples, the rigid structure 304 occupies a comparatively smaller footprint on the PCB 204 compared to a conventional encapsulation that surrounds the SMD 202. For example, with reference to FIG. 6A, a wall thickness 602 of an example corner shield 302 may be less than 0.3 mm, and in some examples may include a wall thickness in the range 0.05 to 0.30 mm. These comparatively small dimensions can provide a significant footprint reduction when compared to a 1 mm side thickness 226 of a conventional encapsulation 206 for example. A length of the first protective wall 306 may be in the range 0.1 to 10 mm. A length of the second protective wall 308 may be in the range 0.1 to 10 mm. The length of the first protective wall 306 and the second protective wall 308 may, or may not, be the same in some examples. A height of the first protective wall 306 above the upper surface of the PCB may be in the range 0.1 to 3 mm. A height of the second protective wall 308 above the upper surface of the PCB may be in the range 0.1 to 3 mm. The height of the first protective wall 306 and the second protective wall 308 may, or may not, be the same in some examples.

Figure 6B:
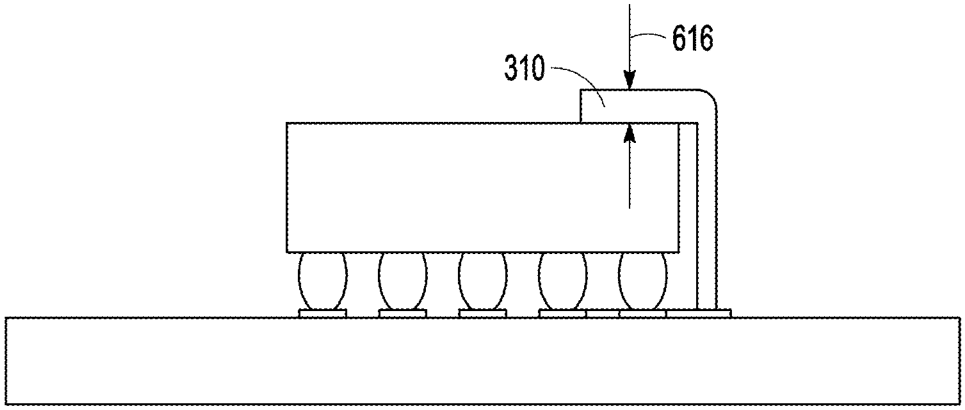
FIG. 6B is a top view of an example corner shield adjacent a protected SMD.

Further in some examples, with reference to FIG. 6B, an overhang structure thickness 616 of a protective overhang structure 310 of an example corner shield 302 may be less than 0.15 mm, and in some examples may include an overhang structure thickness 616 in the range 0.1 to 0.3 mm. These comparatively smaller dimensions can also provide, alone or in conjunction with the reduced wall thicknesses, a significant volume reduction when compared to a 0.3 mm top thickness 236 of a conventional encapsulation 206 for example. A length, or height, or thickness of a corner shield 302 may be based judiciously to minimize volume taken on a counterpart or corresponding dimension of an SMD 202 that the corner shield 302 is selected to protect.

Each of the first protective walls 306 and/or the second protective wall 308 has an underside or lower mounting surface 314 configured to support the rigid structure 304 on the PCB 204. The mounting surface 314 can be attached or fixed to one or more soldering pads 406 located on the PCB 204 adjacent to the SMD 202. The soldering pads 406 may have been prior installed on the PCB 204 in some examples, based on the dimension of a corner shield 302 that they are configured to receive. In some examples, a mounting surface 314 may be defined by a separate or integral mounting element or foot provided on the corner shield 302.

Application of a protective corner shield 302 to a given SMD, for example, can mitigate, if not avoid, increases in reliability risk because, unlike an encapsulant, the protected SMD and the protective walls of the protective corner shield do not touch each other in some examples. A clearance or stand-off distance between the protected SMD 202 and first protective wall 306, and also between the SMD 202 and the second protective wall 308 is visible in FIGS. 6A-6B. The protective overhang structure 310 may also be located at a clearance or stand-off distance from an upper surface or point of the protected SMD 202, but in some examples (as shown, for example in FIGS. 6A-6B) may touch or abut an upper surface or point of the protected SMD 202 to assist in securing the SMD 202 to the PCB 204 and/or providing increased stability under impacts or knocks.

In some examples, the rigid structure 304 is configured to be mounted to the PCB 204 using a standard surface-mount technology (SMT) soldering process. In some examples, the one or more mounting surfaces 314 (or mounting elements or feet) comprise solderable surfaces that align with the soldering pads on the PCB 204.

In some examples, the corner shield 302 may be mounted to a PCB using mechanical fasteners or adhesive, or using through-hole techniques, but soldering may be more convenient in some examples as additional fasteners and adhesive may interact negatively or unexpectedly with the SMDs and/or take up usable volume otherwise available for components. Additionally, the convenience of being able to use existing SMT soldering processes avoids adding an entirely new process to an assembly flow. Moreover, because the corner shield 302 is typically made of metal or a metallic material (for example stainless steel, copper or aluminum, or alloys thereof), the corner shield 302 may require electrical grounding. Soldering conveniently grounds the corner shield 302 whereas other methods of protection such as encapsulation do not offer or provide this convenience.

In some examples, the rigid structure 304 is formed as an integral one-piece structure. In other examples, the rigid structure 304 is formed from separate parts. For example, the protective overhang structure 310 may be affixed as a separate part to the first protective wall 306 or the second protective wall 308. In some examples, the rigid structure 304 is formed from a material selected from the group consisting of copper, aluminum, stainless steel, and alloys thereof.

Some examples of this disclosure also include methods. To this end, a method for protecting an SMD on a PCB may comprise aligning a corner shield adjacent to a corner of the SMD, the corner shield comprising a rigid structure, the method further comprising soldering one or more mounting surfaces of the corner shield to soldering pads on the PCB to mount the corner shield. The method may further comprise picking and placing the corner shield using standard SMT equipment. One advantage of using a corner shield 302 in such a method over standard encapsulation is that deployment of the corner shield 302 does not affect the "reworkability" of the PCB. In other words, an SMD protected by a corner shield 302 can still be unsoldered for replacement or repositioning elsewhere on the PCB. With encapsulation, once an SMD is encapsulated, if is very difficult if not impossible to effect any repairs to the PCB or rework it at that point.

EXAMPLES

Example 1. A corner shield for protecting a surface-mount device (SMD) on a printed circuit board (PCB), the corner shield comprising: a rigid structure configured to conform to a corner area of the SMD; and one or more mounting surfaces configured to mount the rigid structure to one or more soldering pads on the PCB adjacent to the SMD.

Example 2. The corner shield of Example 1, wherein the one or more mounting surfaces comprise solderable surfaces that align with the one or more soldering pads on the PCB.

Example 3. The corner shield of Example 1 or Example 2, wherein the rigid structure includes a first protective wall, a second protective wall, and a protective overhang structure.

Example 4. The corner shield of Example 3, wherein the second protective wall is disposed substantially orthogonally to the first protective wall to extend laterally therefrom.

Example 5. The corner shield of Example 3, wherein the protective overhang structure is shaped and arranged to define a vent for the corner shield.

Example 6. The corner shield of Example 5, wherein the vent is defined or provided between an edge of the protective overhang structure and an edge of the first protective wall and/or and edge of the second protective wall.

Example 7. The corner shield of Example 3, wherein a flat upper surface of the protective overhang structure defines or provides a vacuum pick up area.

Example 8. The corner shield of Example 3, wherein a length of the first protective wall is in a range of 0.1 to 10 mm.

Example 9. The corner shield of Example 3, wherein a length of the second protective wall is in a range of 0.1 to 10 mm.

Example 10. The corner shield of Example 3, wherein a height of the first protective wall above an upper surface of the PCB is in a range 0.1 to 3 mm.

Example 11. The corner shield of Example 3, wherein a height of the second protective wall above an upper surface of the PCB is in a range 0.1 to 3 mm.

Example 12. The corner shield of Example 3, wherein an overhang structure thickness of the protective overhang structure is in a range 0.1 to 0.3 mm.

Example 13. The corner shield of any one of Examples 1 to 12, wherein the rigid structure is formed from a material selected from a group comprising copper, aluminum, stainless steel, and alloys thereof.

Example 14. The corner shield of any one of Examples 1 to 13, wherein the rigid structure is configured to be mounted to the PCB using a surface-mount technology (SMT) soldering process.

Example 15. The corner shield of any one of Examples 1 to 14, wherein the rigid structure is configured to absorb mechanical shocks and impacts to protect the SMD from damage.

Example 16. The corner shield of any one of Examples 1 to 15, wherein the rigid structure is an integral one-piece structure.

Example 17. The corner shield of any one of Examples 1 to 16, wherein the rigid structure occupies a comparatively smaller footprint on the PCB compared to an encapsulation that surrounds the SMD.

Example 18. A method for protecting a surface-mount device (SMD) on a printed circuit board (PCB), the method comprising: aligning a corner shield adjacent to a corner of the SMD, the corner shield comprising a rigid structure; and soldering one or more mounting surfaces of the corner shield to a respective soldering pad on the PCB to mount the corner shield on the PCB.

Example 19. The method of Example 18, further comprising picking and placing the corner shield using surface mount technology (SMT) equipment.

Example 20. The method of Example 18 or Example 19, wherein the corner shield is configured to absorb mechanical shocks and impacts to protect the SMD from damage.

While the above is a detailed description of some examples of the inventive subject matter, various alternatives, modifications, and equivalents may be used. Therefore, the above description should not be taken as limiting the scope of the inventive subject matter which is defined by the appended claims.

What is claimed is:

1. A corner shield for protecting a surface-mount device (SMD) on a printed circuit board (PCB), the corner shield comprising: a rigid structure configured to conform to a corner area of the SMD; and one or more mounting surfaces configured to mount the rigid structure to one or more soldering pads on the PCB adjacent to the SMD, wherein the rigid structure includes a first protective wall, a second protective wall, and a protective overhang structure, wherein the protective overhang structure is shaped and arranged to define a vent for the corner shield, and wherein the vent is defined or provided between an edge of the protective overhang structure and an edge of the first protective wall and/or and edge of the second protective wall.

2. The corner shield of claim 1, wherein the one or more mounting surfaces comprise solderable surfaces that align with the one or more soldering pads on the PCB.

3. The corner shield of claim 1, wherein the second protective wall is disposed substantially orthogonally to the first protective wall to extend laterally therefrom.

4. The corner shield of claim 1, wherein a flat upper surface of the protective overhang structure defines or provides a vacuum pick up area.

5. The corner shield of claim 1, wherein a length of the first protective wall is in a range of 0.1 to 10 mm.

6. The corner shield of claim 1, wherein a length of the second protective wall is in a range of 0.1 to 10 mm.

7. The corner shield of claim 1, wherein a height of the first protective wall above an upper surface of the PCB is in a range 0.1 to 3 mm.

8. The corner shield of claim 1, wherein a height of the second protective wall above an upper surface of the PCB is in a range 0.1 to 3 mm.

9. The corner shield of claim 1, wherein an overhang structure thickness of the protective overhang structure is in a range 0.1 to 0.3 mm.

10. The corner shield of claim 1, wherein the rigid structure is formed from a material selected from a group comprising copper, aluminium, stainless steel, and alloys thereof.

11. The corner shield of claim 1, wherein the rigid structure is configured to be mounted to the PCB using a surface-mount technology (SMT) soldering process.

12. The corner shield of claim 1, wherein the rigid structure is configured to absorb mechanical shocks and impacts to protect the SMD from damage.

13. The corner shield of claim 1, wherein the rigid structure is an integral one-piece structure.

14. The corner shield of claim 1, wherein the rigid structure occupies a comparatively smaller footprint on the PCB compared to an encapsulation that surrounds the SMD.

15. A method for protecting a surface-mount device (SMD) on a printed circuit board (PCB), the method comprising: aligning a corner shield adjacent to a corner of the SMD, the corner shield comprising a rigid structure; and soldering one or more mounting surfaces of the corner shield to a respective soldering pad on the PCB to mount the corner shield on the PCB, wherein the rigid structure includes a first protective wall, a second protective wall, and a protective overhang structure, wherein the protective overhang structure is shaped and arranged to define a vent for the corner shield, and wherein the vent is defined or provided between an edge of the protective overhang structure and an edge of the first protective wall and/or and edge of the second protective wall.

16. The method of claim 15, further comprising picking and placing the corner shield using surface mount technology (SMT) equipment.

17. The method of claim 15, wherein the corner shield is configured to absorb mechanical shocks and impacts to protect the SMD from damage.

* * * * *